United States Patent [19]
Valentian

[11] Patent Number: 5,559,391
[45] Date of Patent: Sep. 24, 1996

[54] THREE-GRID ION-OPTICAL SYSTEM

[75] Inventor: Dominique Valentian, Rosny, France

[73] Assignee: Societe Europeenne de Propulsion, Suresnes, France

[21] Appl. No.: 391,503

[22] Filed: Feb. 21, 1995

[30] Foreign Application Priority Data

Feb. 24, 1994 [FR] France ................................. 94 02108

[51] Int. Cl.⁶ .................................................. H01J 23/18
[52] U.S. Cl. ...................................... 313/360.1; 315/5.37
[58] Field of Search .............................. 313/360.1, 362.1, 313/363.1, 231.41, 231.71, 268, 292; 315/5.37, 111.81

[56] References Cited

U.S. PATENT DOCUMENTS

| 4,841,197 | 6/1989 | Takayama et al. | 315/111.81 |
| 5,017,835 | 5/1991 | Oechsner | 315/111.81 |

FOREIGN PATENT DOCUMENTS

| 0339554 | 4/1989 | European Pat. Off. | H01J 27/16 |
| 0406441 | 12/1989 | European Pat. Off. | H01J 29/04 |
| 0526420 | 7/1992 | European Pat. Off. | H01J 27/02 |

OTHER PUBLICATIONS

Davydenko et al., "Study of a four-electrode multiple-slit system for ion-beam formation.", *Instruments and Experimental Techniques* 24:(5)1116–1117, 1981.

Zhuravleve et al., "Cold-cathode gas-discharge ion source.", *Instruments and Experimental Techniques* 28:(4)907–909, 1985.

Primary Examiner—Sandra L. O'Shea
Assistant Examiner—Mark Haynes
Attorney, Agent, or Firm—Weingarten, Schurgin, Gagnebin & Hayes

[57] ABSTRACT

The present invention relates to an ion-optical system for a gas-discharge ion source, the system comprising a screen grid and an accelerator grid each constituted by a respective frame and a set of wires held parallel by supports and fixed to said frames by means of springs, the frames and the grids being assembled together by means of insulators to which they are fixed. According to the invention, the system further comprises a decelerator grid constituted by a frame and a set of wires, the frame of the decelerator grid being engaged in the frame of the accelerator grid and being separated therefrom by insulators. The supports of the wires are constituted either by a comb-shaped plate or by rollers with at least one of the rollers installed in the screen grid being shaped so as to be barrel-shaped, having a larger diameter in its center than at its ends. The pitch of the wires of the screen grid is preferably determined in such a manner as to ensure that the outermost beams converge towards the central beam by a predetermined amount.

11 Claims, 6 Drawing Sheets

THREE-GRID ION-OPTICAL SYSTEM

TECHNICAL FIELD

The present invention relates to the field of gas-discharge ion source, and more exactly it relates to an ion-optical system for a gas-discharge ion source and can be used in systems for forming intense ion beams.

PRIOR ART

Ion-optical systems are known for gas-discharge ion sources that comprise two (or more) electrodes formed by flanges and grids in the form of flat disks with holes (H. R. Kaufman and R. S. Robinson, Minimum hole size in ion-optical, J. Spacecraft and Rockets 1985, Vol. 22, No. 3, pp. 381–382).

However, those known ion-optical systems constituted by flat grids having coaxial cylindrical orifices deform in operation under the effect of thermal stresses due to the heating of the structure, thereby putting at risk the coaxiality of the orifices and causing the clearance between the grids to vary (modifying the geometrical parameters), which can cause the perveance of each optical unit to vary and then, if the clearance is reduced, can give rise to an increase in electrostatic forces that can cause the grids to come into contact and thus provoke a short circuit. In addition, the diameter of plane ion-optical systems is limited in practice to 100 mm.

A known remedy applied to ion sources in space consists in using curved grids (spherical grids) that are much less sensitive to thermal deformation and to the destabilizing influence of electrostatic forces.

Nevertheless, that technology suffers from being very complex and particularly expensive.

When an ion-optical system uses traditional grids with perforated round orifices whose axes are at the vertices of equilateral triangles, the transparency $d_F$ of the grid (the ratio between the total surface area of orifices of diameter (d) to the total surface area of the grid) is determined by a known formula:

$$d_F = 0.91\, d^2/(d+l)^2$$

An increase in the transparency makes it possible to use the surface which constitutes the source of ions more effectively; the current density through the ion-optical system decreases with increasing orifice diameter (d), so it is desirable to make grids in the form of disks having small orifices and high transparency. For that purpose, it is necessary for the thickness (l) of the bridge between orifices to be not less than 0.5 mm, which is not technologically easy. With such a configuration having round orifices, the maximum transparency that can be obtained for the screen grid is about 0.67. The use of hexagonal orifices makes it possible to raise this maximum value to 0.7.

An ion-optical system for a gas-discharge ion source is also known that includes an accelerator grid and a screen grid both constituted by parallel wires fixed to frames by blade springs and constituting outlet slits, associated with groups of insulators on which the frames are installed (SU-A-472396).

Using such electrodes constituted by frames carrying wires, it is possible in that system to use orifices of small diameter, thereby providing an ion-optical system having high transparency, greater than 0.7.

Nevertheless, various drawbacks are observed in that type of ion-optical system having clearance (slits) between the grid wires of 0.3 mm to 0.5 mm. Firstly operating stability is poor because of the difficulties of mutually adjusting the positions of the wires on the screen or accelerator grids, with positioning inaccuracy giving rise to ions being captured by the accelerator grid and to rapid wear thereof, thus disturbing operation of the ion source. Then, a consequence of the cathode erosion of the accelerator grid is to cause the residue of said erosion to be sprayed onto the medium that is to be treated, thereby putting limitations on the fields in which the apparatus can be used. Finally, that two-grid structure can accept only restricted variations in the voltages applied to the grids.

DESCRIPTION OF THE INVENTION

The object of the invention is to provide an ion-optical system for a gas-discharge ion source that has a structure enabling the three-dimensional positions of the electrode wires in operation of the ion source to be set up and then kept constant, and enabling the operating stability of the system to be improved while conserving high transparency. Another object of the invention is to increase the flexibility of the apparatus with respect to its operating ranges and with respect to its fields of utilization, in particular by very considerably reducing the pollution caused by erosion of the accelerator grid.

To solve this problem, the invention proposes an ion-optical system for a gas discharge ion source, the system comprising a screen grid and an accelerator grid constituted by respective frames and respective sets of wires held parallel by supports and fixed to the frames by means of springs, the frames and the grids being assembled together by means of insulators to which they are fixed, the system further comprising a decelerator grid constituted by a frame and a set of wires, the frame of the decelerator grid being engaged in the frame of the accelerator grid and being separated therefrom by insulators.

The presence of the decelerator grid serves to limit the pollution caused by erosion of the accelerator grid, thereby making it possible to increase the range of applications open to the apparatus and to increase its reliability.

Preferably, the pitch of the wires of the screen grid is determined in such a manner as to ensure that the outermost beams converge towards the central beam by a predetermined amount, advantageously lying in the range 4° to 6°, and thus enabling perveance to be modified locally.

Advantageously, in order to reduce bulk, said supports for the wires are constituted by respective plates in the form of combs.

In order to reinforce the convergence effect, when the supports are constituted by rollers, they are given a barrel shape, i.e. having a diameter that varies, being greater in the center than at its ends. This special shape for rollers that are well adapted to the screen grid can also be adopted for the other grids.

The diameter of the wires in the decelerator grid is preferably identical to or greater than the diameter of the wires in the screen grid, but less than the diameter of the wires in the accelerator grid, and at least the wires of the accelerator grid are coated by PVD, CVD, or plasma type deposition in a deposit that is advantageously made of silicon, boron, or carbon, and that is designed to reduce the cathode erosion rate of the corresponding grid.

To ensure that the ion-optical system of the invention is suitable for being dismantled, the wires of the various grids that are connected to and tensioned by the springs, are themselves clamped via sockets that are secured to said springs by means of respective rings made of shape memory alloy.

In certain applications where it is preferable for the ion beam leaving the ion-optical system to be focussed over a rectangular section, the system of the invention advantageously includes a square plate placed on the path of the ion beam that passes through the wire grids and constituting a target of the material that is to be deposited on a substrate, said plate being inclined at a determined angle relative to the axis of the ion beam and contributing to cathode erosion of the material that is to be deposited taking place at the maximum rate (the angle preferably lies in the range 30° to 45°).

BRIEF DESCRIPTION OF THE DRAWINGS

Other characteristics and advantages of the present invention appear more clearly from the following detailed description of a preferred embodiment given by way of non-limiting indication and with reference to the accompanying drawings, in which.

PREFERRED EMBODIMENT OF THE INVENTION

Figure 1:
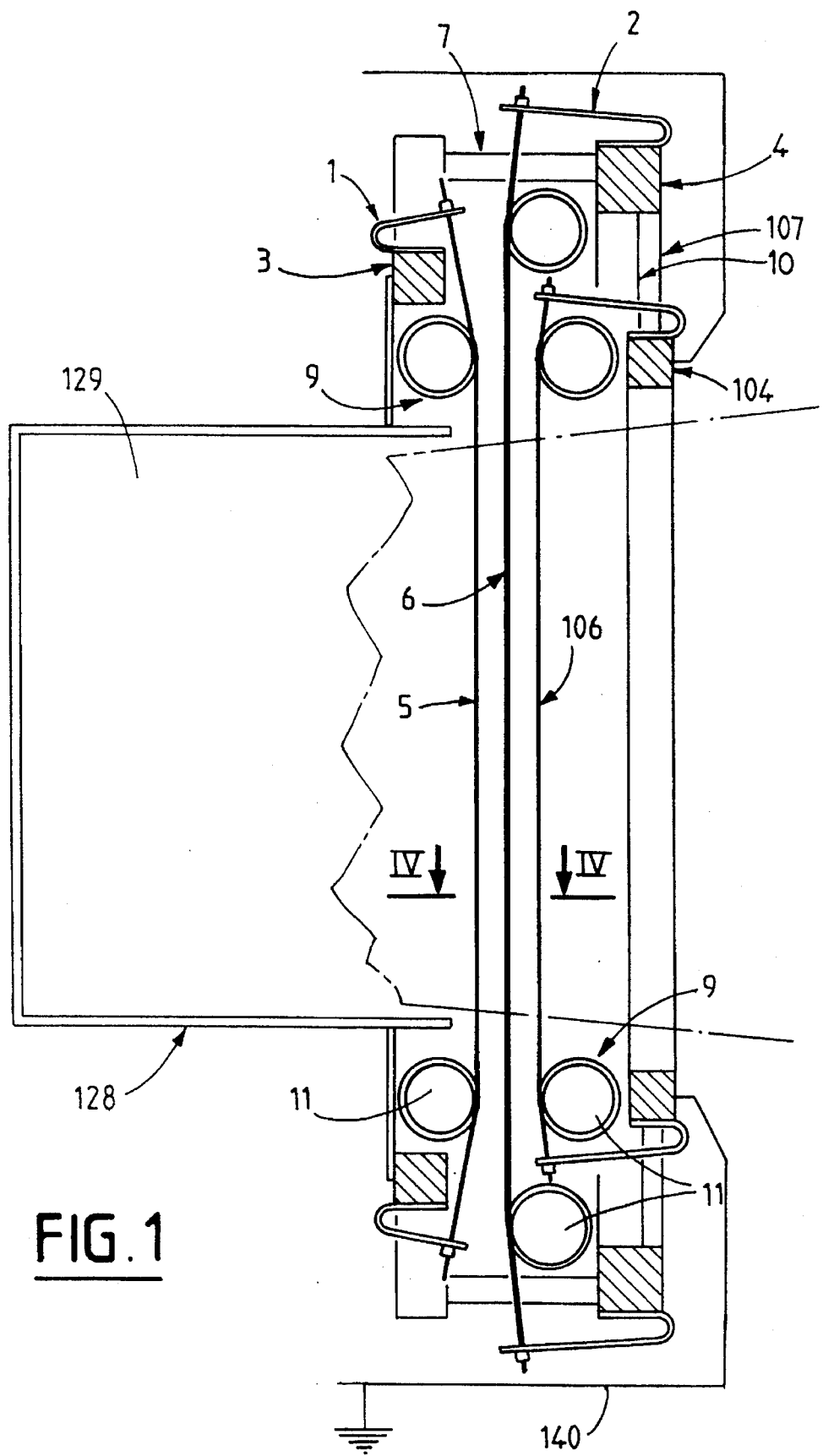
FIG. 1 is a simplified cross-section through a three-grid ion-optical system of the invention.

In FIG. 1 the ion-optical system of the invention for a gas-discharge ion source has three grids (electrodes): a screen grid 1; an accelerator grid 2; and a decelerator grid 10; the grids being constituted by respective frames 3, 4, 104 which are associated with respective systems of parallel wires 5, 6, and 106. Insulators 7 are placed between the frames 3 and 4, and 107 between the frames 4 and 104. A device 9 for displacing the wires in each of the three grids enables the various intergrid distances to be adjusted to small predetermined values. The frame 104 of the decelerator grid 10 is connected to the ground of the ion source via a screen 140. By an appropriate disposition of the frames 4 and 104 which are engaged one within the other (FIG. 2) it is possible to provide intergrid distances that are very small.

The ions are extracted through the screen grid 1 from plasma 129 produced by an ionization chamber 128.

Figure 2:
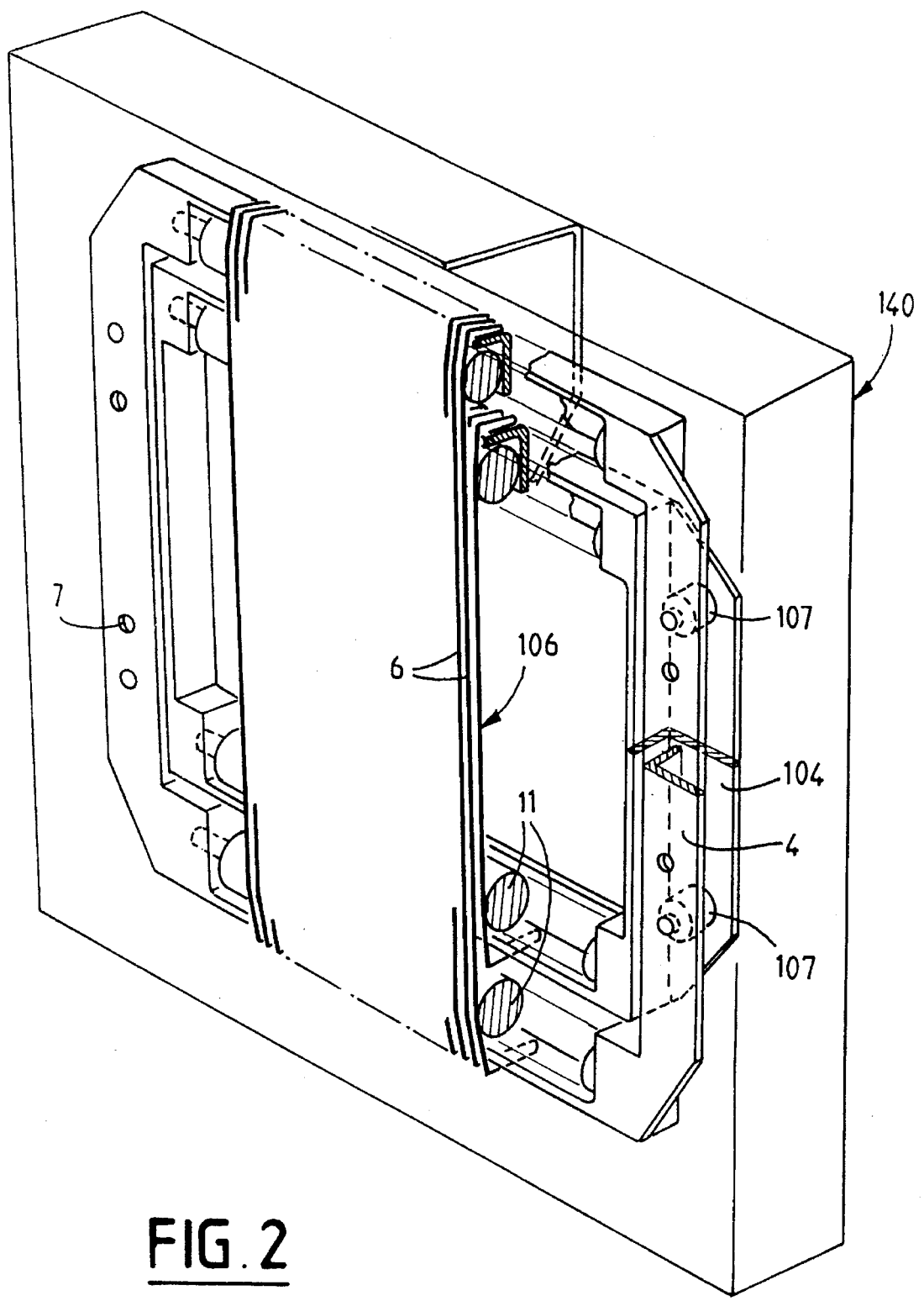
FIG. 2 shows how the accelerator and decelerator grids of the FIG. 1 system are interfitted.
Figure 3:
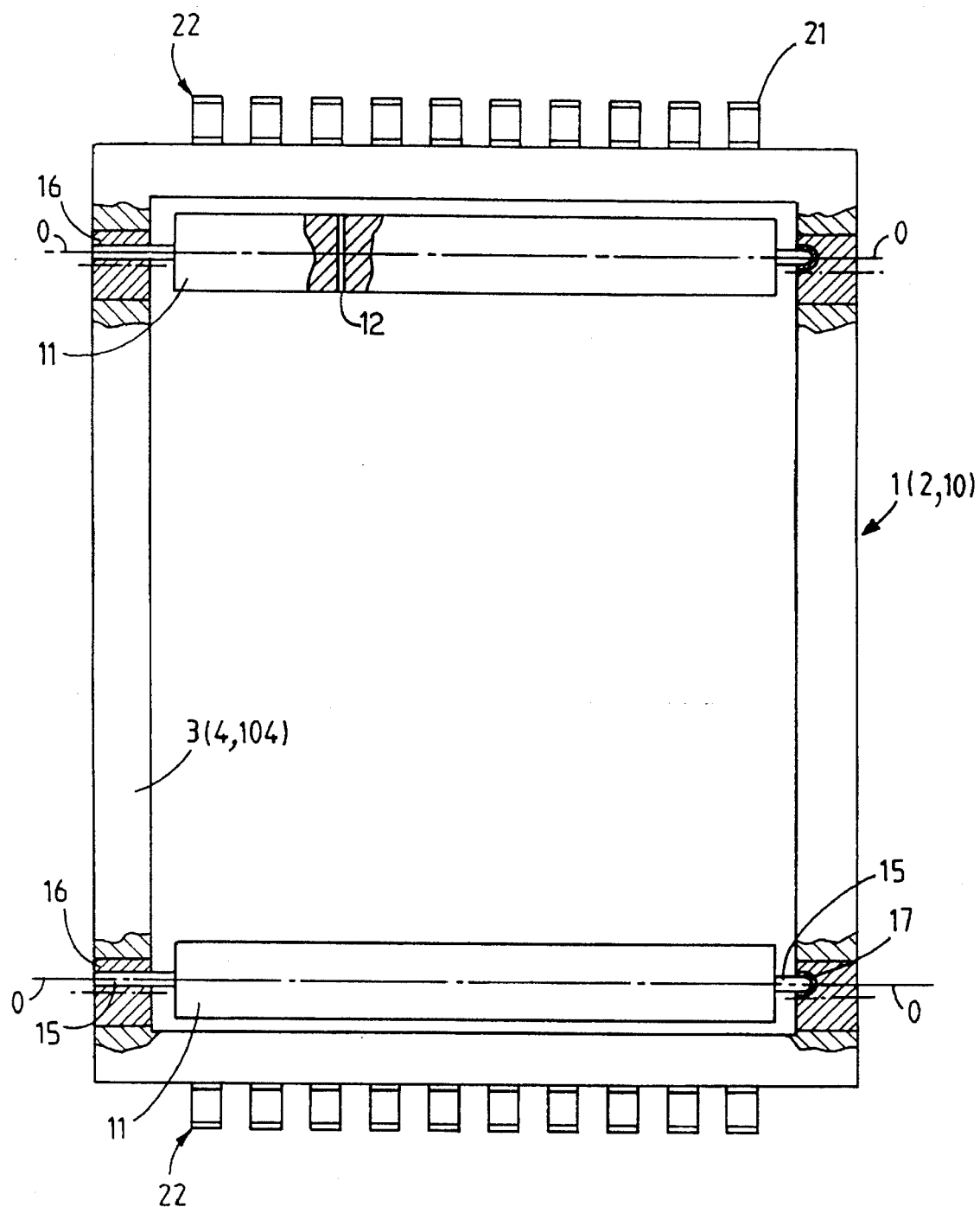
FIG. 3 shows the structure of the screen grid in the FIG. 1 system.
Figure 5A:
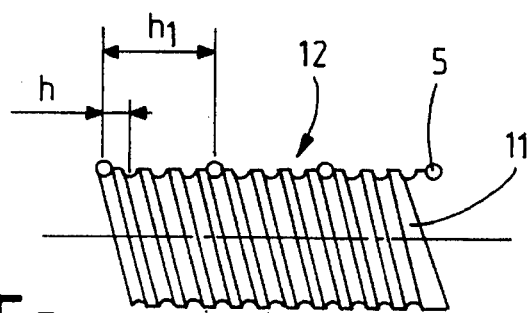
FIG. 5a shows a detail of a wire support constituted by a roller that is threaded.

As shown in FIGS. 2 and 3, the device 9 for displacing the wires (which device is identical for each grid) comprises supports 11 that are advantageously disposed in pairs on opposite ends of a frame, which supports extend transversely to the wires 5, 6, or 106 of the grid in question, the wires being associated with guide elements 12 that are provided on the outside surfaces of the supports. The guide elements may be constituted by circular grooves (see FIGS. 1 and 6a) or, preferably, by a thread (see FIG. 5a) whose pitch h is equal to the pitch $h_1$ of the wires or is an integer ratio smaller than said pitch, thereby making it possible where necessary (see the description of FIG. 7 for further details) to dispose the wires in each grid at a specified pitch.

The mutual engagement of the frames 4 and 104 is facilitated by each of them being made of L-section members, thus making it possible to insulate them from each other by means of the insulators 107 being disposed between the respective parallel walls of the section bars.

Figure 5B:
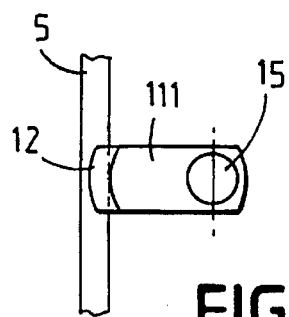
FIG. 5b shows another support device for the wires of the grids.

The supports are constituted merely by rollers 11, or if it is desired to limit overall size, by thick plates 111 in the form of a comb (FIG. 5b).

The rollers 11 (or the plates 111) of each wire displacement device 9 are installed in the frames 3, 4, and 104 of the corresponding grids so as to be capable of rotating about their axes O—O and of changing position in three dimensions together with the wires. To this end, each of the rollers is installed via its own stub axles 15 in eccentric plugs 16 disposed in the frames with the ability to rotate about their own axes, one of the ends of each roller being coupled to the eccentric plug 16 via pivot means 17. It may be observed that this disposition also makes it possible to separately adjust the mean intergrid distance and the lack of parallelism between the grids.

Figure 4:
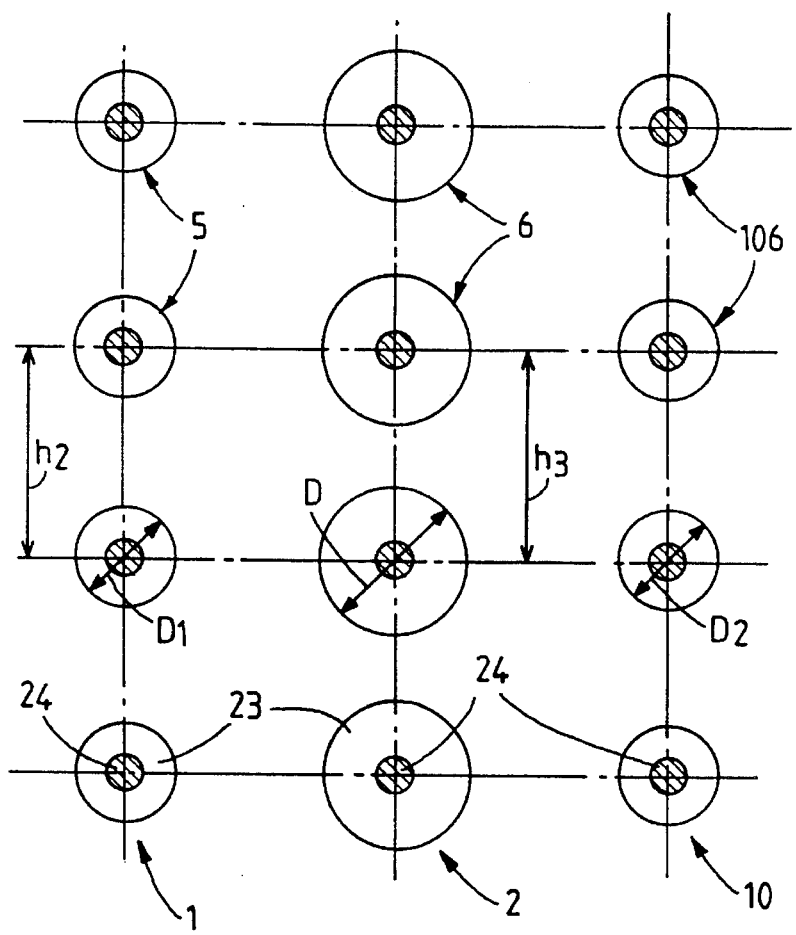
FIG. 4 shows a detail of all three grids in section on III—III of FIG. 1.

Depending on the field in which the proposed ion-optical system is to be used, the wires 5 of the screen grid 1 may be disposed at a pitch $h_2$ equal to the pitch $h_3$ of the wires 6 of the accelerator grid 2 (FIG. 4) or at a pitch that is an integer ratio smaller than the pitch of the wire 6 of the accelerator grid 2, thereby having the result that a single slit in the accelerator grid 2 is permeable to ion beams formed by a plurality of slits in the screen grid 1. The wires 6 of the accelerator grid 2 are of a diameter D that is greater than the diameter $D_1$ of the wires 5 of the screen grid 1 so that the transparency of the grid 1 is greater than the transparency of the grid 2, which gives rise to better efficiency of the system in terms of gas, the transparency of the ion-optical system in terms of ions being determined under such circumstances by the transparency of the screen grid 1 and its transparency in terms of atoms by the transparency of the accelerator grid 2. Similarly, the diameter $D_2$ of the wires of the accelerator grid 10 is preferably identical to or greater than the diameter $D_1$ of the screen grid wires, while nevertheless not exceeding the diameter D of the accelerator grid wires.

Figure 6A:
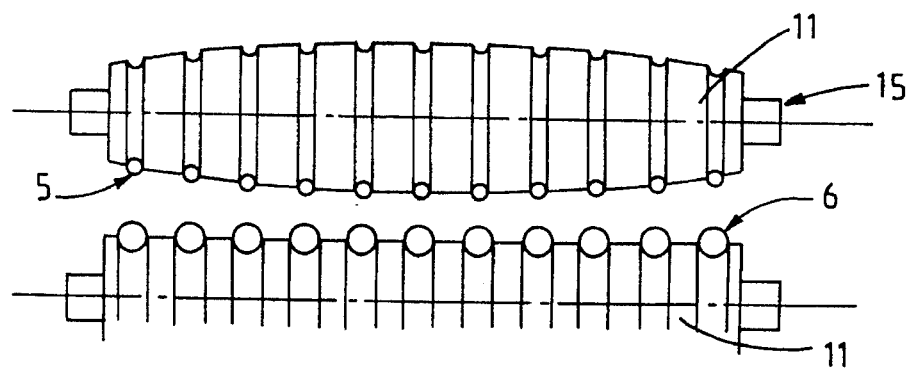
FIG. 6a shows a variant embodiment of a roller.
Figure 6B:
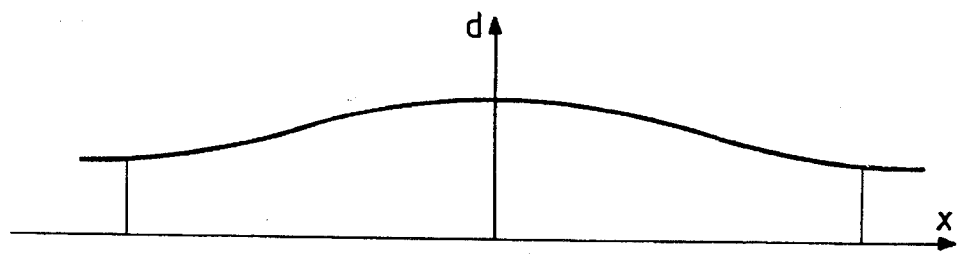
FIG. 6b is a curve showing the ion density profile at the outlet from the system.

In the ion-optical system, when the intergrid clearance between the grid 5 and the accelerator grid 6 is small, and when currents are close to the limits, it is difficult to maintain the divergence angle of the ion beam within given limits. Also, in order to adapt local perveance to local density in the ionization chamber, it is possible to modify the profiles of the rollers supporting the wires of the screen grid 5 in such a manner as to cause the rollers to be barrel-shaped, being larger in diameter in their centers than at their ends (see FIG. 6a). FIG. 6b shows the ion density profile downstream from the optics obtained using rollers of this structure. This barrel shape can also be envisaged for the accelerator and decelerator grids.

Figure 7:
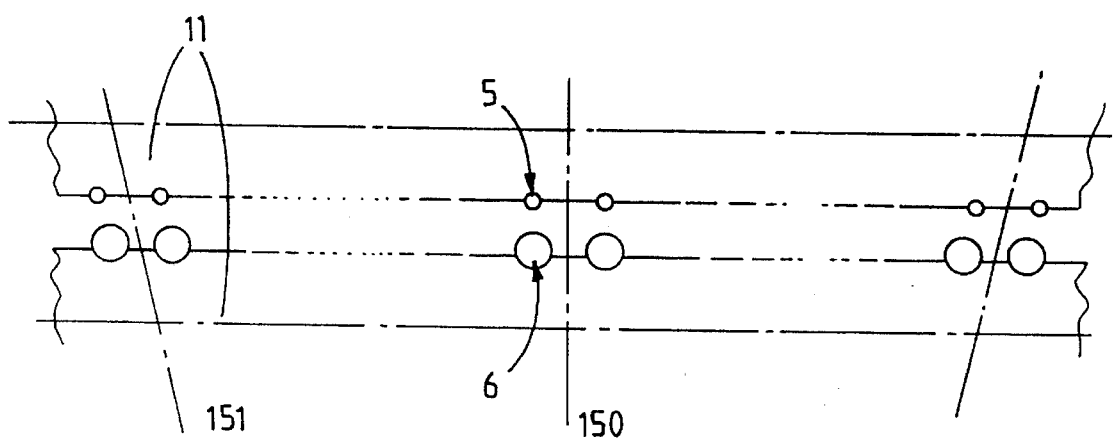
FIG. 7 shows a variant embodiment of the rollers suitable for ensuring convergence of the ion beam.

The convergence of the ion beam can also be improved by modifying very slightly the pitch of the wires in the grids, as shown (with deliberate exaggeration) in FIG. 7. It is thus possible to cause the outermost unit beams 151 to converge by a few degrees, advantageously in the range 4° to 6° towards the central beam 150. Naturally, this disposition can be combined with the above barrel structure, thereby adapting the local perveance and reinforcing the convergence effect.

Returning to FIGS. 3 and 4, the wires 5, 6, and 106 of the grids 1, 2, and 10 are fixed (the fixing means are described with reference to FIG. 9) to blade springs 21 that are secured to the frames 3, 4, and 104, said springs being aligned parallel to the rollers 11 and being placed in a common row 22 along each of the opposite sides of the frames. To reduce the load on the springs 21, the wires of the grids are advantageously made as two coaxial portions 23 and 24 with the tube-forming outer portion constituting a snug fit on the inner portion. When only the wires 6 of the accelerator grid are made in two coaxial portions, the inner portions 24 of such wires preferably have the same diameter as the wires 5 and 106 of the screen grid and of the decelerator grid. This embodiment of the accelerator grid thus provides the option of rapidly replacing the worn portion as reduced in size by its material being eroded while the source is in operation, thereby making it possible to increase the lifetime of the grid. Another solution for reducing such cathode erosion, also known as "sputtering", of the accelerator grid consists in eliminating interactions between the neutral (or reagent) gases and the grid by using a chemically compatible coating or, e.g. in an application to etching microcircuits, a coating that is compatible with the semiconductor to be etched, thereby eliminating the consequences of pollution due to such erosion.

It is easy to make a deposit on a wire by chemical vapor deposition (CVD) or by physical vapor deposition (PVD), or by any other equivalent method such as plasma deposition, whereas making such a deposit is more complex in a prior art grid that has holes. For example, when a coating of silicon on tungsten-is eroded, it gives rise to a deposit of silicon on the microcircuit to be etched, and that is of no consequence, whereas contamination by the tungsten would pollute the microcircuit. Boron and carbon are other substances that are particularly well adapted to constituting such a deposit.

The ion-optical system described is put into operation in conventional manner: a potential corresponding to the energy of the ions in the beam, e.g. in the range +700 V to +3 kV, is applied to the screen grid 1 (FIG. 1) and a potential of −0.2 kV to −2 kV is applied to the accelerator grid 2, which is required to establish an extraction potential difference. The decelerator grid is connected to ground. The outlet frame 140 normally implemented in the form of a grid that is annular or of square section is likewise grounded. In the discharge chamber of the source, the plasma is automatically stabilized in the vicinity of the screen grid in the region where plasma neutrality does not exist. By using grids of wires 5 and 6 made as shown in FIGS. 2 and 3 and rollers 11 designed as shown in FIG. 6a, the specified transparency is attained for the accelerator grid 2 and the screen grid 1, and the divergence of the ion beam does not exceed the specified values. The presence of the decelerator grid 10 makes it possible to capture erosion residues coming from the accelerator grid 6, thereby avoiding any pollution of the substance that is to be treated. Likewise, by replacing each wire of the screen grid with three or more wires occupying a determined geometrical pattern, it is possible to establish more accurately both the equipotentials in the acceleration zone and the limit of the plasma in the ionization chamber.

If it is necessary to achieve a specified shape for the surface of each grid and to ensure that the wires coincide, then the wires are installed and positioned initially by means of the device 9.

The specified shape for each grid can be achieved by rotating the eccentric plus 16 (FIG. 2) with the wires then moving in a direction perpendicular to the plane of the frame. The slits in the various grids are brought into coincidence by rotating the rollers 11 about their own axes.

For example, by using a cathetometer it is possible to guarantee that the geometrical accuracy of the parameters of the ion-optical system are accurate to within ±0.01 mm.

The possibility of performing the above-specified adjustments serves to increase the operating stability of the ion source, since high accuracy is guaranteed in the positioning of the wires relative to one another within each grid, and also in the desired value of the intergrid spacing. The wires are held mutually in position while the system is in operation, thereby ensuring stable and durable operation of the ion source.

Figure 8:
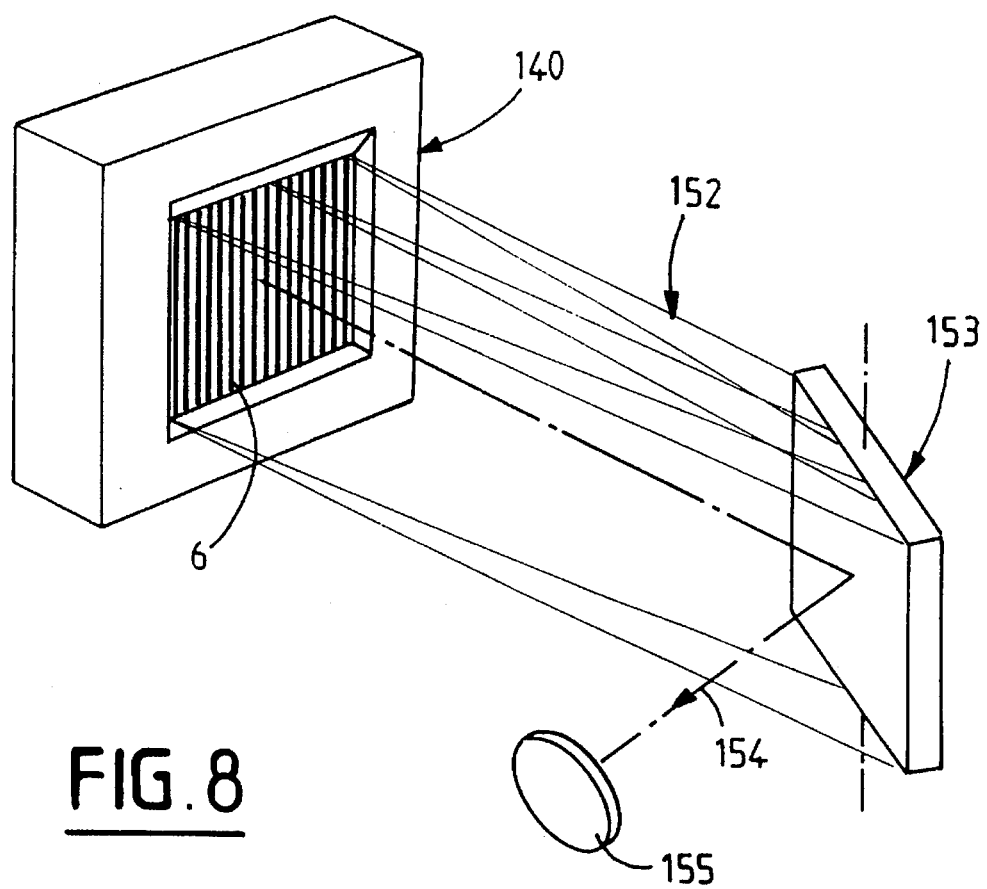
FIG. 8 shows how a particular optics system can be used to achieve better focusing of the ion beam.

In certain specific applications, such as coating by cathode erosion, it is advantageous to focus the beam which is initially square in section on a section that is rectangular. FIG. 8 shows a simple technique of achieving such focusing. For this purpose, the ion beam 152 leaving the outlet frame 140 of the ion-optical system is directed towards a square target plate 153 that is disposed at an angle of 30° to 45° relative to the axis of the beam so as to ensure a maximum sputtering coefficient, and the substance to be treated 155, i.e. the substrate to be coated, for example, receives atoms 154 that have been torn off said plate under the effect of cathode erosion.

Figure 9:
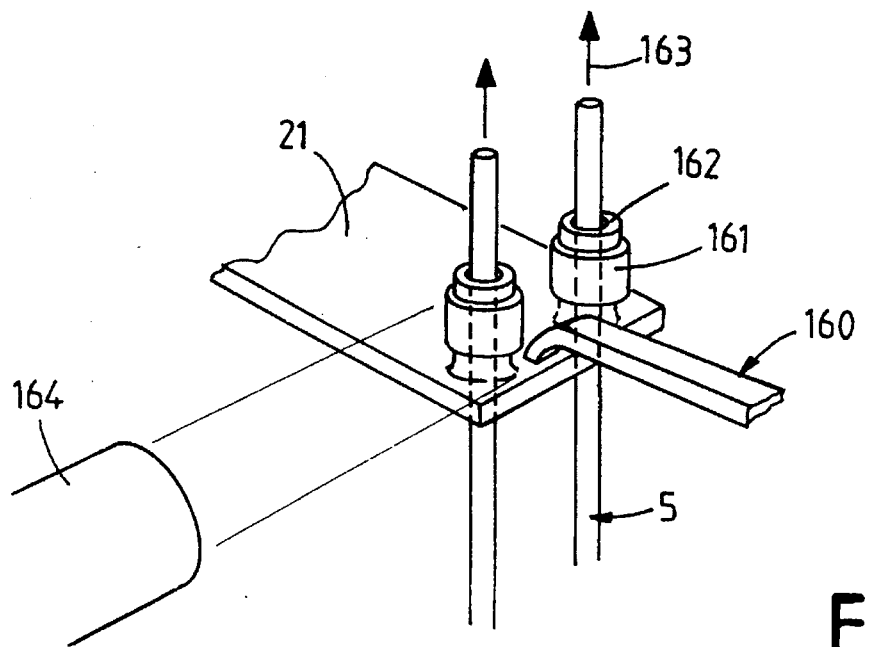
FIG. 9 shows a detail of the method for fixing the grid wires.

FIG. 9 shows how the various wires 5, 6, and 106 are fixed to the blade springs 21 in each of the frames 3, 4, and 104. These wires, e.g. the wires 5, are fixed to the springs 21 by means of rings 161 made of shape memory alloy and each secured to an internal socket 162 integral with the spring. The wires are fixed by clamping the sockets onto the wires under the action of a cold gas (delivered by a tube 164) designed to cause the rings to change state, and this requires no more than simple tooling 160 for prestressing the spring and subjecting the wire to traction 163. With this kind of fixing, it is easy to dismount the wires and also the rollers.

Because of its excellent performance, the three-grid ion-optical system of the invention is applicable to extended ion sources using ionization of a gas by one of the following processes:

ionization by electron bombardment (so-called Kaufman ion sources);

ionization by a radiofrequency field (ion sources of the radiofrequency ion thruster (RIT) type; or indeed ionization by electronic cyclotron resonance (ECR).

This optics system is applicable in particular:

to propulsion in space as a replacement for traditional curved grids; or to industrial applications such as etching microcircuits, ion machining, vacuum deposition by sputtering.

In such industrial applications, the ion-optical system using wires has two essential advantages:

the divergence of the ion beam in a plane parallel to the wires is very small, which is advantageous in etching applications; and the perveance of optics based on wires is very high, thereby making it possible to extract higher ion density for the same net acceleration voltage, which is advantageous in medium energy industrial applications (500 eV).

I claim:

1. An ion-optical system for a gas-discharge ion source, the system comprising a screen grid and an accelerator grid constituted by respective frames and respective sets of wires held parallel by supports and fixed to the frames by means of springs, the frames and the grids being assembled together by means of insulators to which they are fixed, the system further comprising a decelerator grid constituted by a frame and a set of wires, the frame of the decelerator grid being engaged in the frame of the accelerator grid and being separated therefrom by insulators.

2. An ion-optical system according to claim 1, wherein the pitch of the wires of the screen grid is determined in such a manner as to ensure that the outermost beams converge towards the central beam by a predetermined amount.

3. An ion-optical system according to claim 2, wherein the predetermined amount of convergence for the outermost beams lies in the range 4° to 6°.

4. An ion-optical system according to claim 1, wherein said supports for the wires are constituted by respective plates in the form of combs.

5. An ion-optical system according to claim 1, wherein said supports are constituted by rollers with at least one of the rollers installed in the screen grid being shaped so as to be barrel-shaped, having a larger diameter in its center than at its end.

6. An ion-optical system according to claim 1, wherein the diameter of the wires of the decelerator grid is identical to or greater than the diameter of the wires of the screen grid, but less than the diameter of the wires of the accelerator grid.

7. An ion-optical system according to claim 6, wherein, at least the wires of the accelerator grid are coated by a PVD, CVD, or plasma type deposition designed to reduce the cathode erosion rate of said grid.

8. An ion-optical system according to claim 7, wherein the deposited coating is constituted by a substance such as silicon, boron, or carbon.

9. An ion-optical system according to claim 1, wherein the wires of the various grids are connected to and tensioned by springs via sockets secured to said springs and clamped on the wires by rings made of shape memory alloy.

10. An ion-optical system according to claim 1, further comprising a square plate placed on the path of the ion beam that passes through the grids of wires and constituting a target of the material to be deposited on a substrate, said plate being inclined at a given angle relative to the axis of the beam of ions.

11. An ion-optical system according to claim 10, wherein said given angle of inclination lies in the range 30° to 45°.

* * * * *